(12) United States Patent
Inanami et al.

(10) Patent No.: US 7,368,737 B2
(45) Date of Patent: May 6, 2008

(54) ELECTRON BEAM WRITING METHOD, ELECTRON BEAM WRITING APPARATUS AND SEMICONDUCTOR DEVICE MANUFACTURING METHOD

(75) Inventors: Ryoichi Inanami, Yokohama (JP); Tetsuro Nakasugi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 199 days.

(21) Appl. No.: 11/409,987

(22) Filed: Apr. 25, 2006

(65) Prior Publication Data
US 2006/0289797 A1    Dec. 28, 2006

(30) Foreign Application Priority Data
Apr. 26, 2005    (JP)    ............... 2005-128231

(51) Int. Cl.
*H01J 37/08*    (2006.01)
(52) U.S. Cl. .................. 250/492.22; 250/492.23
(58) Field of Classification Search ........... 250/492.22, 250/492.23
See application file for complete search history.

(56) References Cited
U.S. PATENT DOCUMENTS 6,481,004 B2    11/2002    Inanami et al.
6,803,589 B2    10/2004    Nakasugi
7,002,167 B2 *  2/2006    Ogasawara ............ 250/492.22

FOREIGN PATENT DOCUMENTS

| JP | 5-36594 | 2/1993 |
|---|---|---|
| JP | 2512184 | 4/1996 |
| JP | 2526326 | 6/1996 |
| JP | 10-284385 | 10/1998 |
| JP | 2002-237445 | 8/2002 |
| JP | 2004-127967 | 4/2004 |

* cited by examiner

*Primary Examiner*—Kiet T. Nguyen
(74) *Attorney, Agent, or Firm*—Finnegan, Henderson, Farabow, Garrett & Dunner, L.L.P.

(57) ABSTRACT

An electron beam writing method is disclosed, which includes preparing electron beam writing data structured from writing pattern data expressed by both data of VSB shots which are units of shaping beams at the time of carrying out writing a pattern and data of CP shots serving as bases of a repeating pattern, and CP aperture data into which identification numbers IDs and opening positions of respective openings of a CP aperture having openings for VSB shots and openings for CP shots are described, inputting the electron beam writing data to an electron beam writing apparatus, and expanding the electron beam writing data into data of the respective shots defined in the electron beam writing data, determining irradiation times of the respective expanded shots while correcting shot positions, and outputting control signals corresponding to shot data to repeat a shot of a desired pattern, by the electron beam writing apparatus.

12 Claims, 4 Drawing Sheets

| CPID | | Sx₁ | Sy₁ | Px₁ | Py₁ | D₁ |
|---|---|---|---|---|---|---|
| | N | | | | | |
| ID₁ | | | | | | |
| ⋮ | | | | | | |
| IDₙ | | SxN | SyN | PxN | PyN | DN |

CPID = Character ID
N = Number of patterns by VSB shot

VSB shot data of CPID = 100CP:

| 0 | 100 | | 3.5 | 0.5 | 3 | 1.05 |
|---|---|---|---|---|---|---|
| 0 | 0.5 | | 0.5 | 0.5 | 0.0 | 1.00 |
| 0 | 4.0 | | 0.5 | 0.5 | 2.5 | 1.05 |
| 0 | 0.5 | | 3.5 | 0.5 | 4.0 | 1.05 |

VSB shot data of CPID = 101CP:

| 0 | 101 | | 1.8 | 0.5 | 6 | 1.10 |
|---|---|---|---|---|---|---|
| 0 | 0.0 | | 0.5 | 3.0 | 0.0 | 1.05 |
| 0 | 0.5 | | 0.5 | 0.5 | 0.5 | 1.10 |
| 0 | 1.3 | | 1.8 | 0.5 | 3.5 | 1.10 |
| 0 | 0.0 | | 1.8 | 0.5 | 3.5 | 1.10 |
| 0 | 2.5 | | 0.5 | 3.0 | 0.5 | 1.05 |
| 0 | 2.5 | | 1.8 | 0.5 | 0.5 | 1.05 |
| 0 | 2.5 | | | | 0.0 | 1.10 |

F I G. 6

ELECTRON BEAM WRITING METHOD, ELECTRON BEAM WRITING APPARATUS AND SEMICONDUCTOR DEVICE MANUFACTURING METHOD

CROSS-REFERENCE TO RELATED APPLICATIONS

This application is based upon and claims the benefit of priority from prior Japanese Patent Application No. 2005-128231, filed Apr. 26, 2005, the entire contents of which are incorporated herein by reference.

BACKGROUND OF THE INVENTION

1. Field of the Invention

The present invention relates to an electron beam direct writing technique by which circuit patterns of a semiconductor device are written by repeatedly exposing minute shaped beams, and in particular, to an electron beam writing method, an electron beam writing apparatus which draw patterns by using a variable shaped beam (VSB) and a character projection (CP), and a semiconductor device manufacturing method.

2. Description of the Related Art

In electron beam lithography, in particular, electron beam direct writing technique, when a circuit pattern is transcribed onto a resist on a semiconductor substrate, there in no need to prepare a corresponding mask of a circuit pattern for each of the devices having different circuit patterns. Further, the wavelength of an electron beam is much shorter than the wavelength of a light-source light used for light exposure writing, and it is therefore possible to form a fine pattern. Therefore, the electron beam direct writing technique is applied to the research and development of a prototype QTAT (Quick Turn Around Time) device, a fine edge device or the like.

In electron beam lithography, a circuit pattern is broken up into a plurality of basic graphic figures, which are units of exposure. Then, electron beams having shapes and sizes which are the same as those of the respective basic graphic figures are shaped by using a plurality of shaping apertures. The shaped electron beams are sequentially irradiated onto a resist. Each irradiation of an electron beam is called a shot. As methods for shaping electron beams, there are two types: a variable shaped beam (VSB) method and a character projection (CP) method. In the variable shaped beam (VSB) method, patterns broken up into a rectangle, a triangle, and a trapezoid, which are the basic graphic figures, are inputted and the overlapping of two shaping apertures is controlled to form rectangular and triangular electron beams. On the other hand, in the character projection (CP) method, openings having shapes which are the same as the basic shapes are formed in shaping apertures, the shape of the cross section of the electron beam is made into a basic shape (which is called a character), and an electron beam is deflected to pass through the corresponding opening of a shaping aperture when a pattern which is the same as a shape of an opening is inputted. In an electron beam writing apparatus using the CP method, generally, not only the CP method in which a shape of cross section of an electron beam is shaped into a basic shape (character) formed in a shaping aperture, but also the VSB method in which rectangular and triangular electron beams are shaped by controlling the overlapping of two shaping apertures are used. A shaping aperture having a character shaped opening is called a CP aperture, and the number of character openings selectable by deflecting electron beams is generally several to several hundred (Jpn. Pat. Appln. KOKAI Publication No. 10-284385, Jpn. Pat. Registration No. 2512184, and Jpn. Pat. Registration No. 2526326).

Figure 7:
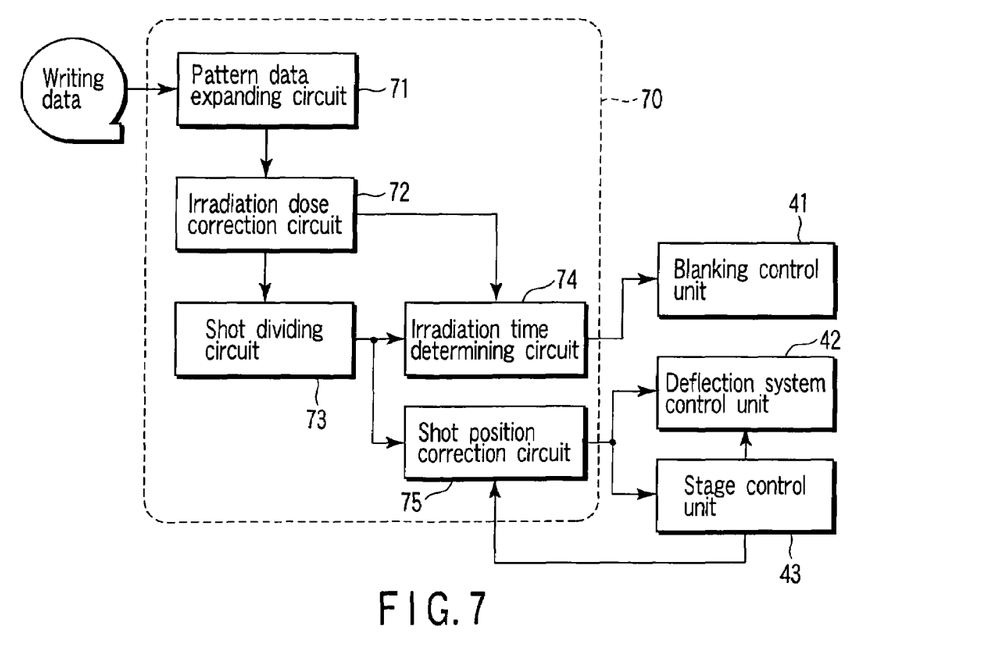
FIG. 7 is a block diagram showing a structure of a writing control circuit used for a conventional electron beam writing apparatus.

A conventional electron beam writing apparatus has an electron beam writing device having an electron gun, various deflection systems, various lens systems, and a stage system, or the like, and a writing control circuit 70 as shown in FIG. 7 which outputs a signal for controlling the deflection systems and the stage system of the electron beam writing apparatus corresponding to electron beam writing data.

The writing control circuit 70 has a pattern data expanding circuit 71, an irradiation amount correction circuit 72, a shot dividing circuit 73, an irradiation time determining circuit 74, and a shot position correction circuit 75.

Each pattern data in electron beam writing data expressed by basic graphic figures is expanded by the pattern data expanding circuit 71. The expanded pattern data is corrected with regard to the irradiation amount of electron beam by the irradiation amount correction circuit 72. The irradiation amount correction is typically proximity correction. The corrected pattern data is divided by the shot dividing circuit 73 into patterns having shapes and sizes of formable electron beams. For each pattern, an irradiation time of an electron beam irradiated onto the substrate is determined by the irradiation time determining circuit 74. On the other hand, for each pattern, the electron beam onto the substrate is corrected with regard to the shot position by the shot position correction circuit 75. Then, signals are outputted to a blanking control unit, an electron beam deflection unit, and a stage control unit.

Correction of the irradiation position is performed to correct misalignment of patterns, distortion due to the deflection of an electron beam, or the like. This correction is carried out by feeding an output control signal of the stage control unit for controlling a position of the stage back to the deflection system to correct a signal to be inputted to the writing control circuit 70.

However, there has been the following problem in this type of electron beam writing apparatus. Namely, the number of shots necessary for carrying out writing cannot be determined until electron beam writing data is inputted to the writing control circuit and the pattern data is expanded. Further, an irradiation amount of an electron beam in each shot cannot be determined until writing processing is started. Therefore, the time taken for writing processing cannot be known in advance of the writing processing. In order to know the time taken for writing processing, it is necessary to confirm the writing processing time by actually writing, or to determine the writing processing time by a simulation using electron beam writing data.

Determining the writing processing time by such methods means that writing processing which is not originally required is carried out, and processing carried out mainly by hardware (control circuit) at the time of writing is carried out by software in advance, which take extra time. These processing increase the raw process time (RPT) in electron beam writing in the lithography stage in the semiconductor manufacturing process.

Further, it is impossible to confirm whether or not each shot data generated in the writing control circuit is correct. Therefore, it is difficult to carry out detailed handling of correction of an irradiation amount with respect to a shot pattern.

In this way, conventionally, in an electron beam writing apparatus, in order to determine a writing processing time in advance of the writing processing, processings in which originally unnecessary writing processing is carried out, processing which is carried out mainly by hardware (control circuit) at the time of writing is carried out by software in advance are required. These processing have led to the problem that RPT by electron beam writing in the semiconductor manufacturing process is made longer. Further, there has been the problem that it is impossible to carry out detailed handling of correction of an irradiation amount or the like with respect to a shot pattern.

BRIEF SUMMARY OF THE INVENTION

According to a first aspect of the present invention, there is provided an electron beam writing method in which a pattern is written onto a resist on a substrate by using VSB and CP, the method comprising:

preparing electron beam writing data which is structured from writing pattern data expressed by both data of VSB shots which are units of shaping beams at the time of carrying out writing a pattern and data of CP shots serving as bases of a repeating pattern, and CP aperture data into which identification numbers IDs and opening positions of respective openings of a CP aperture having openings for VSB shots and openings for CP shots are described;

inputting the electron beam writing data to an electron beam writing apparatus; and expanding the electron beam writing data into data of the respective shots defined in the electron beam writing data, determining irradiation times of the respective expanded shots while correcting shot positions, and outputting control signals corresponding to shot data to repeat a shot of a desired pattern, by the electron beam writing apparatus, to write a pattern onto a resist.

According to a second aspect of the present invention, there is provided electron beam writing apparatus to execute an electron beam writing method according to the first aspect, the apparatus comprising:

an electron beam writing device which controls electron beam blanking, electron beam deflection and a position of a stage on which a substrate is to be placed;

a pattern data expanding circuit to which the electron beam writing data is inputted, and which expands the electron beam writing data into respective shot data defined in the electron beam writing data;

an irradiation time determining circuit which determines irradiation times with respect to the expanded shot data; and a position correction circuit which corrects positions of respective shots with respect to expanded pattern data.

According to a third aspect of the present invention, there is provided a semiconductor device manufacturing method, wherein the electron beam writing method as defined in the first aspect is used when a semiconductor device is manufactured.

According to a fourth aspect of the present invention, there is provided semiconductor device manufacturing method using, when a semiconductor device is manufactured, an electron beam writing method in which a pattern is written onto a resist on a substrate by using VSB and CP, the electron beam writing method comprising:

preparing electron beam writing data which is structured from writing pattern data expressed by both data of VSB shots which are units of shaping beams at the time of carrying out writing a pattern and data of CP shots serving as bases of a repeating pattern, and CP aperture data into which identification numbers IDs and opening positions of respective openings of a CP aperture having openings for VSB shots and openings for CP shots are described;

inputting the electron beam writing data to an electron beam writing apparatus; and expanding the electron beam writing data into data of the respective shots defined in the electron beam writing data, determining irradiation times of the respective expanded shots while correcting shot positions, and outputting control signals corresponding to shot data to repeat a shot of a desired pattern, by the electron beam writing apparatus, to write a pattern onto a resist.

DETAILED DESCRIPTION OF THE INVENTION

Embodiments of the present invention will be described hereinafter with reference to the drawings.

First Embodiment

Figure 1:
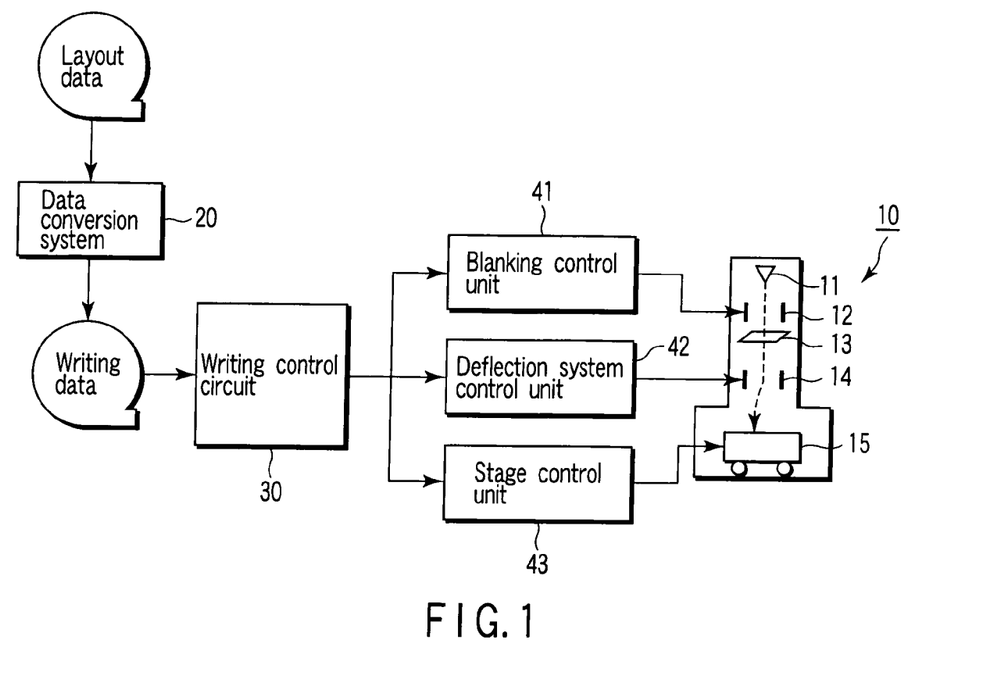
FIG. 1 is a schematic block diagram showing an electron beam writing apparatus according to a first embodiment of the present invention.

FIG. 1 is a diagram schematically showing a structure of an electron beam writing apparatus according to a first embodiment of the present invention.

In FIG. 1, reference numeral 10 is an electron beam writing device. The electron beam writing device 10 has an electron gun 11 which emits an electron beam, a blanking electrode 12 which controls to turn an electron beam on and off, a shaping aperture 13 which shapes an electron beam, a deflecting electrode 14 which deflects an electron beam, and a stage 15 on which a substrate such as a semiconductor wafer is placed. The stage 15 is movable in X and Y directions. The electron beam writing device 10 is of a type in which a pattern is written on a resist on a substrate by using a variable shaped beam (VSB) and character projection (CP). "VSB" is an abbreviation of "variable shaped beam" and is used in the specification and the claims. Similarly, "CP" is an abbreviation of "character projection" and is used in the specification and the claims.

Also in FIG. 1, reference numeral 20 is a data conversion system which converts layout data prepared by a CAD system or the like into writing data for writing using an electron beam, reference numeral 30 is a writing control circuit which controls writing on the basis of writing data, reference numeral 41 is a blanking control unit which controls a timing of irradiation and an irradiation time of an electron beam in each shot, reference numeral 42 is a deflection system control unit which controls the shape of an electron beam and an irradiation position of an electron beam irradiated onto the substrate in each shot, and reference numeral 43 is a stage control unit which controls the position and movement of the stage 15.

The writing control circuit 30 outputs a control signal to the blanking control unit 41, the deflection system control unit 42, and the stage control unit 43 in accordance with writing data inputted to the writing control circuit 30.

Electron beam writing data is generated by converting layout data (generally GDSII STREAM data) of a pattern to be written by the data conversion system 20 in advance of writing by an electron beam. The writing data is expressed in a data format which can be inputted to the writing control circuit 30, and a pattern to be written is expressed in a form of patterns of VSB shots and CP shots.

Figure 2:
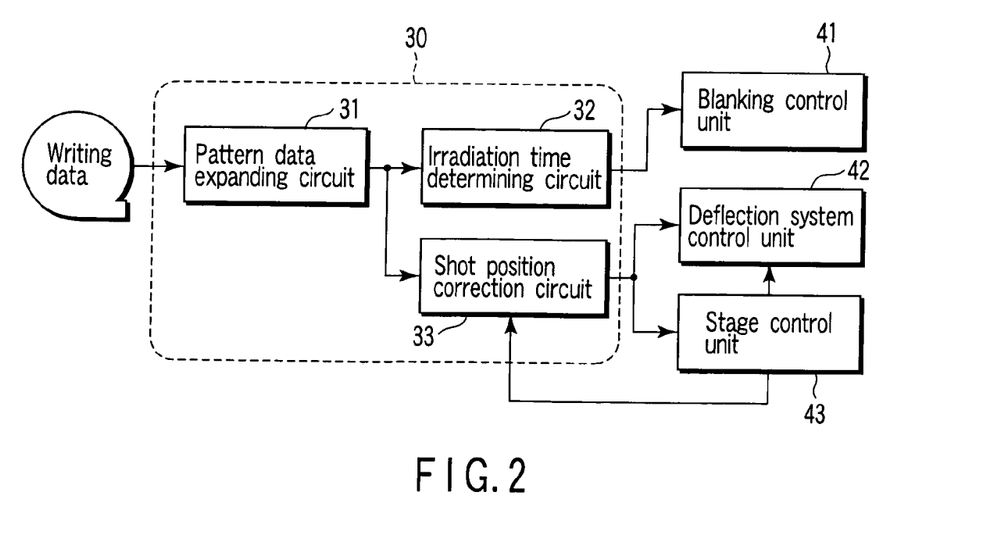
FIG. 2 is a block diagram showing the structure of a writing control circuit used for the electron beam writing apparatus of the first embodiment of the present invention.

As shown in FIG. 2, the writing control circuit 30 has a pattern data expanding circuit 31 which expands writing data into shot data, an irradiation time determining circuit 32 which determines an irradiation time of a shot with respect to each expanded pattern data, and a shot position correction circuit 33 which corrects a position of a shot with respect to each expanded pattern data.

The electron beam writing apparatus of this embodiment is different from a conventional apparatus in that writing data inputted to the writing control circuit 30 is not structured from basic graphic figures, but is structured from shot data in units of shaped beams used at the time of actually carrying out writing, i.e., in units of VSB shots and CP shots. In accordance therewith, an irradiation amount correction circuit and a shot dividing circuit are made redundant.

Next, the structure of writing data used for the present embodiment will be described more in detail.

According to the present embodiment, in the data conversion system 20 which converts layout data into writing data, pattern division for VSB shots is carried out with respect to a pattern to which a VSB shot is applied.

Figure 3:
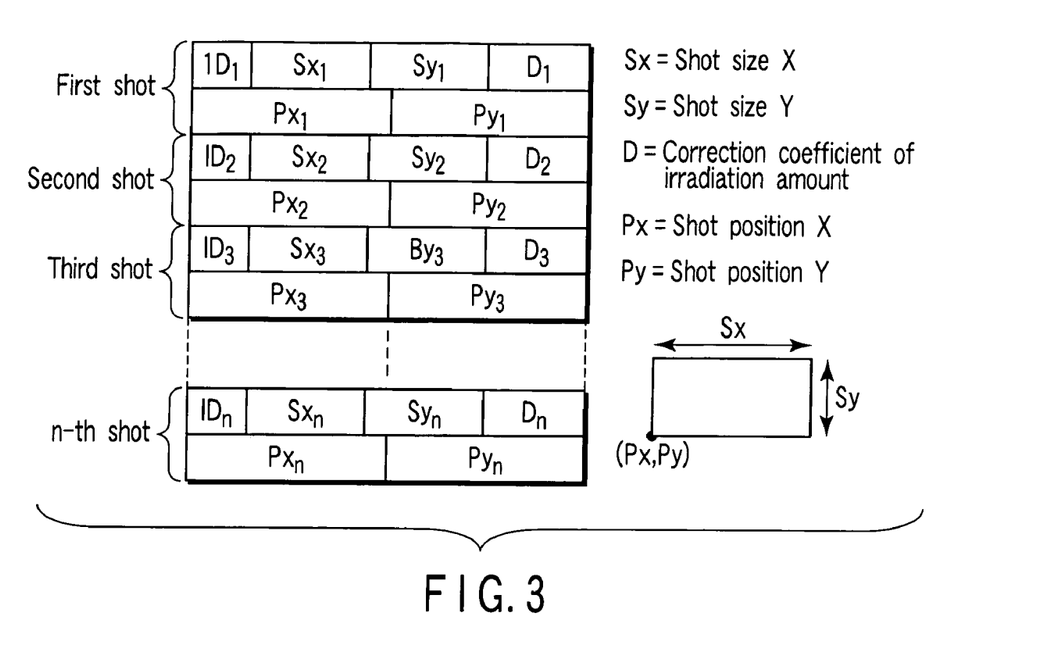
FIG. 3 is a diagram showing the structure of shot data in writing data in the first embodiment of the present invention.

The structure of the shot data in the electron beam writing data (writing pattern data) in this embodiment is shown in FIG. 3. With respect to patterns to which a CP shot is applied, a character ID determined for each CP aperture to be used is described to each shot data. A correction coefficient of an irradiation amount is inscribed to each shot data. An appropriate value is inscribed as the irradiation amount correction coefficient to carry out proximity correction between patterns close to one another and to correct the Coulomb effect between electron beams. An actual irradiation amount is a value arrived at through multiplication of a reference irradiation amount designated at the time of writing by the correction coefficient. A signal to be inputted to the blanking control unit 41 is controlled for each shot so that the irradiation time is adjusted, which results in a desired irradiation amount.

Namely, each shot data has at least:
a character ID corresponding to a CP aperture to be used,
a size (Sx, Sy) of a rectangular beam to be irradiated onto a corresponding character opening of the CP aperture to be used,
an irradiation amount correction coefficient (D), and
an irradiation position of electron beam onto the substrate (Px, Py).

The shot data are described in the electron beam writing data in order of carrying out shots. In addition, a flag denoting the last shot in the deflection region of electron beam may be added to the shot data. When the same shot is repeated, information such as the number of repetitions, a repeating pitch, and the like may be added to the shot data.

Figure 4:
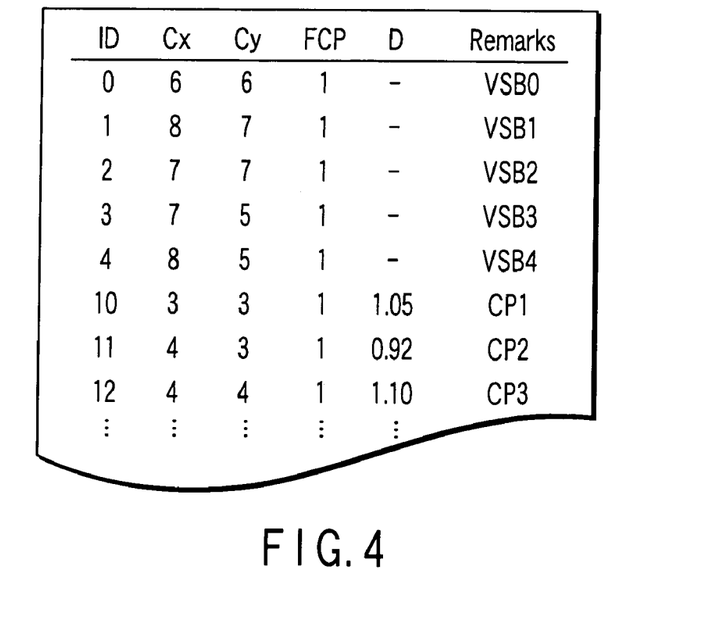
FIG. 4 is a diagram showing the structure of CP aperture data in the writing data in the first embodiment of the present invention.

Electron beam writing data is structured from the writing pattern data of FIG. 3 and CP aperture data as shown in FIG. 4. The CP aperture data are ASCII data showing the correspondence between an ID of each character and a CP aperture in one line for every one character. In each line of the CP aperture data, with a character ID in the lead, sequentially described are:
a position of the character on the CP aperture (Cx, Cy),
a flag denoting whether the character is valid or invalid as the CP shot (Fcp),
an irradiation amount correction coefficient at the time of applying a shot onto the character (D), and
a comment (remarks).

Figure 5:
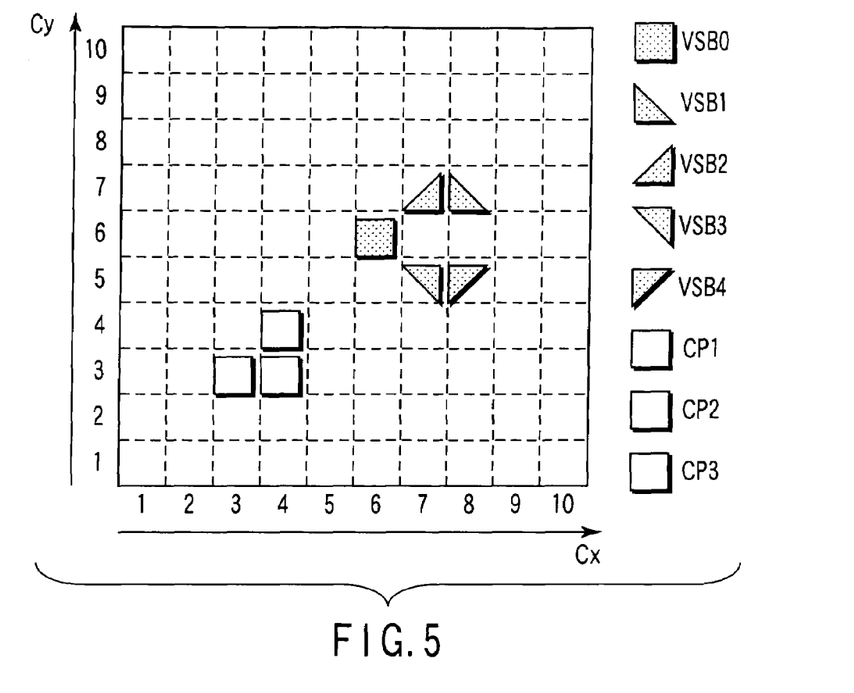
FIG. 5 is a diagram showing an example of a CP aperture layout corresponding to the CP aperture data of FIG. 4.

FIG. 5 shows an example of a CP aperture layout corresponding to the CP aperture data shown in FIG. 4. In this CP aperture layout, as the beam shaping openings for VSB, one rectangular opening and four VSB openings for shaping triangular beams are included, and 0 to 4 character IDs are allocated to these beam shaping openings for VSB. Further, character IDs on and after 10 are allocated to the openings for CP. The positions (Cx, Cy) of the respective openings on the CP aperture are expressed as X and Y coordinates (FIG. 5) shown by Cx and Cy.

When "1" is designated as a flag Fcp denoting whether a CP shot is valid or invalid, the flag shows that the character is valid as a CP shot, and when "0" is designated, the flag shows that the character is invalid as a CP shot. Namely, when "0" is designated as the flag, it means that the character opening should not be used as a CP shot, and a pattern of the character should be shot by a VSB. At the time of data conversion, a CP aperture to be used at the time of writing is assumed and the CP aperture data is referred to, and a pattern which cannot be used as a CP is allocated as a pattern shot by a VSB.

With respect to irradiation amount correction coefficients, values thereof are not written into the VSB lines, and are calculated in the process of the conversion in the VSB lines. On the other hand, a value used as a correction coefficient of an irradiation amount at the time of the CP shot is written into each CP line. In the remarks column, in this case, from what pattern the character is formed is written.

The electron beam writing data used in the present embodiment are formed from at least pattern data as shown in FIG. 3 and CP aperture data as shown in FIG. 4. However, when the pattern data is divided in such a manner that the divided pattern data correspond to respective regions on which writing can be carried out in the process of moving the stage, designation of a writing region may be included in each pattern data. However, even for writing data to which a shot in the CP method is not used, but a shot is applied only in the VSB method, CP aperture data having information on the openings for VSB are designated.

In this way, by using electron beam writing data as shown in the present embodiment, the number of shots necessary for writing, which cannot be conventionally determined unless various arithmetic processings are carried out by inputting writing data to the writing control circuit, can be determined at the time of data conversion. Further, an irradiation amount correction coefficient is designated for each shot, and it can be confirmed whether or not a designated irradiation amount is of an appropriate value by verifying the electron beam writing data. Moreover, when there is an inappropriate shot, it is possible to rewrite the irradiation amount correction coefficient in the writing data.

As described above, by using writing data in accordance with the present embodiment, the number of shots of electron beams necessary for writing a desired pattern and irradiation amount correction coefficients of those shots can be known in advance of writing processing. In accordance therewith, the time taken for writing processing can be accurately estimated.

Further, since the irradiation amount correction circuit and the shot dividing circuit shown in FIG. 7 are unnecessary for the writing control circuit 30 for processing writing data as in the present embodiment, components of the control circuit can be reduced, and the structure can be made simple. Therefore, an attempt can be made to reduce the costs and to reduce the installation space of the writing apparatus.

Moreover, calculation of irradiation amount correction at the time of writing is made unnecessary, and the waiting time taken for the calculation of irradiation amount correction after writing data is inputted can be eliminated, which shorten the writing processing time. Namely, there is no need to carry out in advance verification of writing data on whether or not an appropriate irradiation amount has been designated. Therefore, the writing processing time can be shortened. Moreover, since there is no need to verify whether a shot divided position with respect to a pattern is appropriate or not, the writing processing time can be further shortened. As a result, the RPT can be shortened. Additionally, since shot data can be determined before writing, it is possible to improve the dimensional and positional accuracy in a writing pattern.

Second Embodiment

In the present embodiment, not only writing pattern data and CP aperture data as shown in the first embodiment, but also CP pattern data are included as electron beam writing data. The structure of the writing data and a writing method using the writing data will be described.

The CP pattern data are expressed by VSB shot data when patterns to be shot by CP in electron beam writing data are shot by VSB. In the structure, as shown in FIG. 6, an ID (CPID) of each character pattern is included, the number of data of VSB shots with respect to the character pattern (the number of shots by VSB) is included, and the VSB shot data of the character pattern in which the VSB shot data in the same format as that in FIG. 3 is expressed by the number of VSB shots is repeated by the number of characters mounted on the CP aperture to be used.

Figure 6:
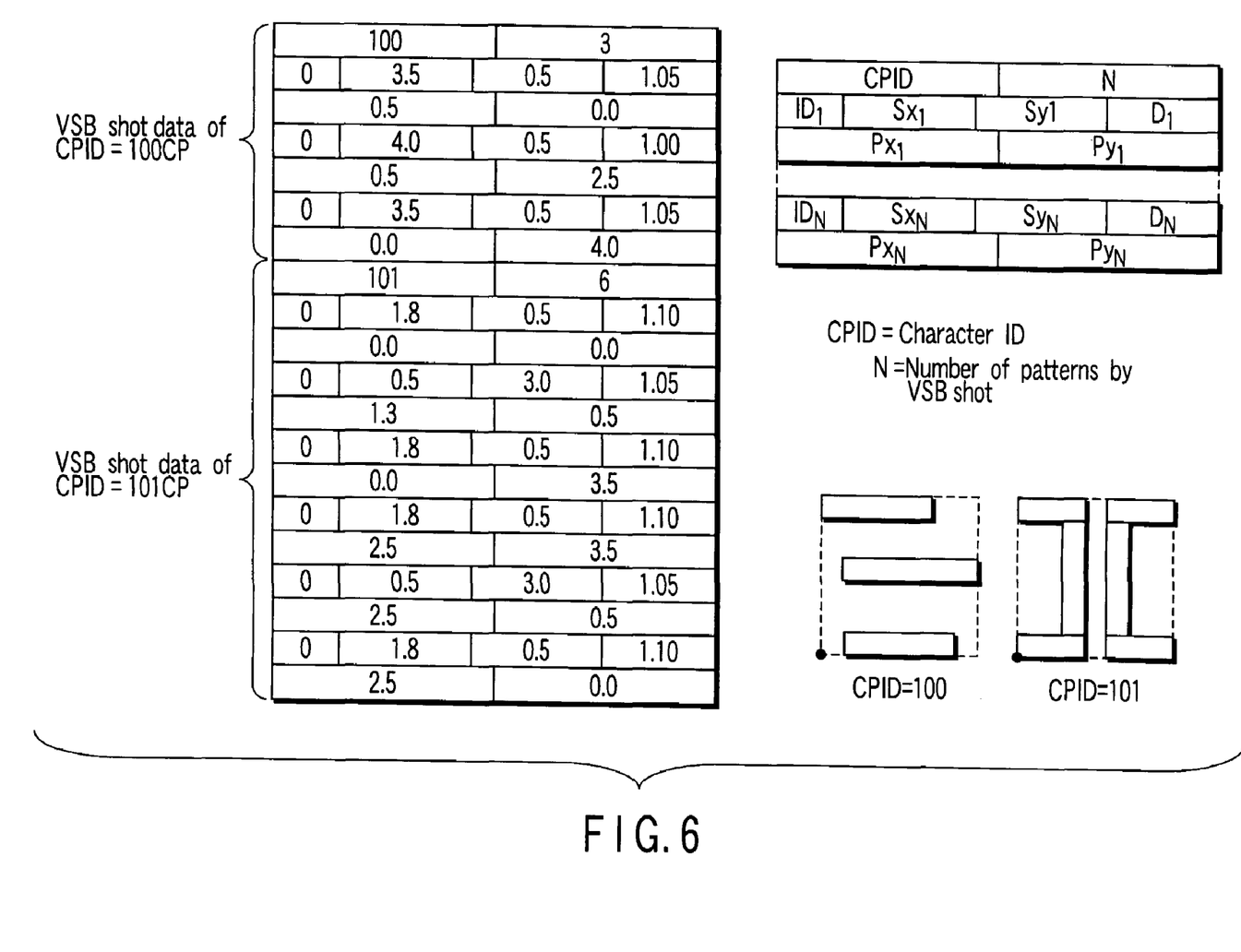
FIG. 6 is a diagram showing the structure of CP pattern shot data in writing data in a second embodiment of the present invention.

In an example of FIG. 6, VSB shot data of two character patterns of CPIDs 100 and 101 are described. The VSB shot data when the character pattern is divided into VSB shots is described on a relative coordinate when an apex in the bottom left corner of a circumscribed rectangle of the character pattern is regarded as a starting point.

In a pattern structured from electron beam writing data including CP pattern data, when a character in which a flag Fcp showing validity ("1") or invalidity ("0") of a CP shot of CP aperture data is valid ("1") at a point in time the writing data has been generated by data conversion, is invalid ("0") at the time of actually carrying out writing, a shot cannot be carried out in the CP method. In the present embodiment, it is possible to carry out writing by expanding the character pattern in the form of VSB shots.

In this case, the pattern data expanding circuit 31 in the writing control circuit 30 of FIG. 2 described above acquires IDs of the shot data in the pattern data, and checks a flag showing the validity or invalidity of a CP shot of a character of a corresponding ID in the CP aperture data. Then, when the flag is "1", a position (Cx, Cy) of a character opening on the CP aperture shown in the CP aperture data is acquired in order to directly carry out a shot by CP. When the flag is "0", VSB shot data of a CPID of the CP pattern data is acquired, and a plurality of VSB shot data are generated by adding a relative shot position of the VSB shot data in CP the pattern data to a shot position (Px, Py) of the shot data in the pattern data.

The writing control circuit 30 carries out an operation for a CP shot or a VSB shot by carrying out the above-described operations.

As shown in the present embodiment, in the writing method in which CP pattern data is included in electron beam writing data, the pattern expanding circuit 31 refers to the validity/invalidity of a CP shot in the writing control circuit 30, and in a case of invalidity, VSB shot data is acquired from the CP pattern data and is expanded into VSB shot data, there is no need to generate respective writing data in accordance with the validity or invalidity of a character opening mounted on the CP aperture. Therefore, as long as the same CP aperture is used, there is no need to execute data conversion again for every change in the condition. Even if the writing data is regenerated, there is no need to do data conversion again from the beginning. It is only needed that shot data for which reading of writing data and a CP shot are made redundant is expanded into VSB shot data. The data expansion generates new writing data.

Further, in this way, even in a case of a pattern shot by a VSB, since the pattern is handled as a CP shot in the writing data, a plurality of VSB shots are described as a one-time CP shot in the writing data. Therefore, the size of the writing data can be prevented from being larger than necessary.

As described above, in a case in which although the electron beam writing data is generated by data conversion as a pattern which can be shot by CP at the time when the writing data has been generated, a CP shot is impossible at the time of writing, when the same CP aperture is repeatedly used, then the CP aperture becomes partially dirty and the character openings may be blocked partially. In this way, in a case in which a character opening is made unavailable, when the unavailable character opening is made available by cleaning the CP aperture, there is no need to repeat data conversion, and it is possible to draw a desired pattern.

To further expand this writing method, it is possible to draw a desired pattern by obtaining CP aperture data by assuming a plurality of CP apertures as one CP aperture and collecting a plurality of CP aperture data of the plurality of CP apertures into one CP aperture data, preparing electron beam writing data by using the CP aperture data, and making character openings of CP apertures other than a CP aperture to be used unavailable in accordance with the CP aperture data used at the time of writing. Namely, electron beam writing data corresponding to a plurality of CP apertures can be prepared, and even if a CP aperture is changed, the same writing aperture can be used as it is. Accordingly, there is no need to retain a plurality of same pattern data, and a waste of media such as hard disks, optical disks, and the like in which writing data are stored can be reduced.

As described above, in accordance with the present embodiment, the patterns in the electron beam writing data inputted to the writing control circuit are divided into patterns to which a VSB shot is applied and patterns to which a CP shot is applied. Then, an irradiation amount or an irradiation amount correction coefficient of an electron beam irradiated onto the substrate in each shot is included in each shot data, thus making the structure of the control circuit simple. Moreover, various operation times of the control circuit can be shortened.

Such writing data is generated by a data conversion system structured from software. Therefore, it is possible to set the irradiation amount of each shot finer on the basis of parameters at the time of data conversion, and moreover, it is possible to carry out highly accurate pattern writing because a result of shot division can be verified in advance.

Further, since CP pattern data being is included in writing data, there is no need to generate the writing data again even if it is impossible to use character openings of the CP aperture, and it is possible to draw a desired pattern. In accordance therewith, there is no need to carry out repeated generation of writing data by data conversion. Moreover, since there is no need to retain a large amount of writing data of the same patterns, it is possible to suppress an increase in computer resources necessary for storing writing data.

(Modified Example)

Note that the present invention is not limited to the embodiments described above. The structure of the electron beam writing device is not limited to one shown in FIG. 1, and can be appropriately changed in accordance with a specification. In the embodiments described above, electron beam writing in which a pattern is written on a resist of a substrate by using both of a variable shaped beam (VSB) and a character projection (CP) has been described. However, the present invention can be applied to a writing method in which writing is carried out by using one of a variable shaped beam (VSB) and a character projection (CP).

In the embodiments described above, a pattern in which a CP shot is set to be invalid by a flag of CP aperture data is allocated as a pattern shot by a VSB. However, it is possible to change the electron beam writing data in advance. Namely, before the electron beam writing data is inputted to the electron beam writing apparatus, CP shot data in which a CP shot is set to be invalid by a flag of CP aperture data is detected, and VSB shot data having a corresponding character pattern in the CP pattern data is acquired on the basis of the detected CP shot data. Then, the acquired VSB shot data is expanded with an irradiation position of an electron beam of a CP shot onto the substrate being as a starting point on a relative coordinate, and writing pattern data in which the CP shot data is expanded into VSB shot data is newly generated. Then, a new electron beam writing data structured from the generated writing pattern data, the CP aperture data, and the CP pattern data is inputted to the electron beam writing apparatus.

The electron beam writing method according to each of the embodiments as describe above may be used when a semiconductor device is manufactured. In those cases, the same advantages will be obtained as those in the disclosed embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam writing method in which a pattern is written onto a resist on a substrate by using VSB and CP, the method comprising:

preparing electron beam writing data which is structured from writing pattern data expressed by both data of VSB shots which are units of shaping beams at the time of carrying out writing a pattern and data of CP shots serving as bases of a repeating pattern, and CP aperture data into which identification numbers IDs and opening positions of respective openings of a CP aperture having openings for VSB shots and openings for CP shots are described;

inputting the electron beam writing data to an electron beam writing apparatus; and expanding the electron beam writing data into data of the respective shots defined in the electron beam writing data, determining irradiation times of the respective expanded shots while correcting shot positions, and outputting control signals corresponding to shot data to repeat a shot of a desired pattern, by the electron beam writing apparatus, to write a pattern onto a resist.

2. The electron beam writing method according to claim 1, wherein the writing pattern data includes shot data described in order of carrying out writing, and each shot data includes an ID of an opening on a CP aperture used at the time of carrying out a CP shot, a size of a rectangular electron beam irradiated onto the opening on the CP aperture, a correction coefficient of an irradiation amount in the shot, and an irradiation position of an electron beam irradiated onto the substrate.

3. The electron beam writing method according to claim 2, wherein each shot data is added with a flag denoting a last shot in a deflection region of electron beam.

4. The electron beam writing method according to claim 2, wherein each shot data is added with the number of repetitions and repeating pitch when a same shot is repeated.

5. The electron beam writing method according to claim 1, wherein the CP aperture data is ASCII data in which information on respective openings formed in a CP aperture to be used are structured in one line for every opening, and the information on each opening includes an ID of a character pattern corresponding to the opening, a position on a CP aperture of the opening, a flag denoting whether the opening is valid or invalid for carrying out a CP shot, and an irradiation amount correction coefficient at the time of applying a shot of a pattern.

6. The electron beam writing method according to claim 5, wherein a value of the irradiation amount correction coefficient is not written into a VSB line as being calculated in the process of conversion from layout data to the electron beam writing data in each VSB shot, and a value used as the correction coefficient of an irradiation amount at the time of the CP shot is written into a CP line.

7. The electron beam writing method according to claim 5, wherein when the writing pattern data is divided in such a manner that the divided pattern data correspond to respective regions on which writing can be carried out in the process of moving the stage, designation of a writing region is included in each pattern data.

8. The electron beam writing method according to claim 5, wherein the electron beam writing data includes CP pattern data in which shot data when a character pattern to which a shot is applied in a CP method is shot in a VSB method are described with respect to respective character patterns, before the electron beam writing data is inputted to the electron beam writing apparatus, CP shot data in which a CP shot is set to be invalid by a flag of CP aperture data is detected, and VSB shot data having a corresponding character pattern in the CP pattern data is acquired on the basis of the detected CP shot data, the acquired VSB shot data is expanded with an irradiation position of an electron beam of a CP shot onto the substrate being as a starting point on a relative coordinate, writing pattern data in which the CP shot data is expanded into VSB shot data is newly generated, and a new electron beam writing data structured from the generated writing pattern data, the CP aperture data and the CP pattern data is inputted to the electron beam writing apparatus.

9. The electron beam writing method according to claim 5, wherein the electron beam writing data includes CP pattern data in which shot data when a character pattern to which a shot is applied in a CP method is shot in a VSB method are described with respect to respective character patterns, and with respect to a character pattern which is set to be invalid for carrying out a CP shot by the flag, VSB shot data corresponding to the pattern is acquired from the CP pattern data, the acquired VSB shot data is expanded with an irradiation position of a CP shot irradiated onto the substrate being as a starting point on a relative coordinate, and writing of the pattern is carried out on the basis of the expanded shot data.

10. An electron beam writing apparatus to execute an electron beam writing method according to claim 1, the apparatus comprising:
   an electron beam writing device which controls electron beam blanking, electron beam deflection and a position of a stage on which a substrate is to be placed;
   a pattern data expanding circuit to which the electron beam writing data is inputted, and which expands the electron beam writing data into respective shot data defined in the electron beam writing data;
   an irradiation time determining circuit which determines irradiation times with respect to the expanded shot data; and
   a position correction circuit which corrects positions of respective shots with respect to expanded pattern data.

11. A semiconductor device manufacturing method, wherein the electron beam writing method as defined in claim 1 is used when a semiconductor device is manufactured.

12. A semiconductor device manufacturing method using, when a semiconductor device is manufactured, an electron beam writing method in which a pattern is written onto a resist on a substrate by using VSB and CP, the electron beam writing method comprising:
   preparing electron beam writing data which is structured from writing pattern data expressed by both data of VSB shots which are units of shaping beams at the time of carrying out writing a pattern and data of CP shots serving as bases of a repeating pattern, and CP aperture data into which identification numbers IDs and opening positions of respective openings of a CP aperture having openings for VSB shots and openings for CP shots are described;
   inputting the electron beam writing data to an electron beam writing apparatus; and
   expanding the electron beam writing data into data of the respective shots defined in the electron beam writing data, determining irradiation times of the respective expanded shots while correcting shot positions, and outputting control signals corresponding to shot data to repeat a shot of a desired pattern, by the electron beam writing apparatus, to write a pattern onto a resist.

* * * * *